(12) United States Patent
Senoo et al.

(10) Patent No.: US 11,380,872 B2
(45) Date of Patent: Jul. 5, 2022

(54) DISPLAY DEVICE AND METHOD FOR MANUFACTURING DISPLAY DEVICE

(71) Applicant: SHARP KABUSHIKI KAISHA, Osaka (JP)

(72) Inventors: Tohru Senoo, Sakai (JP); Takeshi Hirase, Sakai (JP); Hisao Ochi, Sakai (JP); Takashi Ochi, Sakai (JP); Tohru Sonoda, Sakai (JP); Akihiro Matsui, Sakai (JP); Jumpei Takahashi, Sakai (JP); Yoshinobu Miyamoto, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 119 days.

(21) Appl. No.: 17/041,909

(22) PCT Filed: Mar. 29, 2018

(86) PCT No.: PCT/JP2018/013205
§ 371 (c)(1),
(2) Date: Sep. 25, 2020

(87) PCT Pub. No.: WO2019/186882
PCT Pub. Date: Oct. 3, 2019

(65) Prior Publication Data
US 2021/0135159 A1    May 6, 2021

(51) Int. Cl.
*H01L 27/32* (2006.01)
*H01L 51/52* (2006.01)
*H01L 51/56* (2006.01)
*H01L 51/00* (2006.01)

(52) U.S. Cl.
CPC ...... *H01L 51/5253* (2013.01); *H01L 27/3276* (2013.01); *H01L 51/56* (2013.01); *H01L 27/3258* (2013.01); *H01L 51/0097* (2013.01); *H01L 2227/323* (2013.01); *H01L 2251/5338* (2013.01)

(58) Field of Classification Search
CPC ................ H01L 51/5253; H01L 27/3276
See application file for complete search history.

(56) References Cited

U.S. PATENT DOCUMENTS

| | | | | |
|---|---|---|---|---|
| 2019/0363153 A1* | 11/2019 | Matsui | ............. | H05B 33/10 |
| 2019/0363275 A1* | 11/2019 | Ochi | ............. | H05B 33/04 |
| 2020/0150725 A1* | 5/2020 | Saitoh | ............. | H01L 51/0097 |
| 2020/0388660 A1* | 12/2020 | Saitoh | ............. | G09F 9/30 |

FOREIGN PATENT DOCUMENTS

JP    2012-119330 A    6/2012

* cited by examiner

*Primary Examiner* — Douglas M Menz
(74) *Attorney, Agent, or Firm* — ScienBiziP, P.C.

(57) ABSTRACT

A display wiring line provided on a resin substrate layer, a flattening film covering the display wiring line, and an organic EL element provided on the flattening film are provided. The display wiring line includes first to third conductive layers layered sequentially from the resin substrate layer side. In the display wiring line, the second conductive layer is formed with a width smaller than a width of each of the first conductive layer and the third conductive layer, and a portion of a perimeter edge surface corresponding to the second conductive layer includes a recessed portion, and a resin cover covering a perimeter edge surface of the second conductive layer is provided in the recessed portion in a portion of the display wiring line exposed from the flattening film.

16 Claims, 16 Drawing Sheets

DISPLAY DEVICE AND METHOD FOR MANUFACTURING DISPLAY DEVICE

TECHNICAL FIELD

The present disclosure relates to a display device and a method for manufacturing the display device.

BACKGROUND ART

In recent years, a self-luminous organic EL display device using an organic electroluminescence (EL) element has attracted attention as a display device which replaces a liquid crystal display device.

In an organic EL display device, a frame region is provided in a periphery of a display region in which an image is displayed, and a terminal section configured to input a signal to each of a plurality of display wiring lines such as a source wiring line, a gate wiring line, and a power source wiring line led out of the display region is provided in the frame region. In the terminal section, lead-out end portions of the respective display wiring lines are located, and a plurality of terminals including the lead-out end portions are arranged. A mounting component such as a wiring substrate for connecting to an external circuit is mounted on the terminal section.

From the perspective of preventing a characteristic change from occurring between the display wiring lines and a layer being in contact with the display wiring lines while lowering resistance, a layered structure in which a second conductive layer made of a metal material having relatively low electrical resistance is sandwiched between a first conductive layer and a third conductive layer which are made of a metal material excellent in corrosion resistance and stability is suitably employed. For example, the first conductive layer and the third conductive layer are titanium layers, and the second conductive layer is an aluminum layer.

In addition, the display wiring lines are covered by an organic flattening film not only in the display region but also in the frame region. Conduction of terminals of the display wiring lines and the wiring substrate is established through an opening formed in the organic flattening film. To prevent corrosion or the like of the aluminum layer constituting the display wiring line, the organic flattening film covers a peripheral portion of each of the terminals in the terminal section and protects a perimeter edge surface of the terminal (for example, see PTL 1).

CITATION LIST

Patent Literature

PTL 1: JP 2012-119330 A

SUMMARY

Technical Problem

In an organic EL display device, a peripheral portion of a terminal of a display wiring line is covered by an organic flattening film as described above. Thus, at the time of mounting a wiring substrate, the organic flattening film is relatively thick and obstructive. It becomes difficult to establish conduction of the terminal of the display wiring line and the wiring substrate, and there is a problem of difficulty in a mounting step.

The disclosure is made in view of the foregoing, and an object of the disclosure is to easily perform a mounting step of establishing conduction of a mounting component and a wiring line, while protecting a second conductive layer in the wiring line including a layered structure of a first conductive layer, the second conductive layer, and a third conductive layer.

Solution to Problem

A display device according to the techniques of the present disclosure includes: a base substrate; a wiring line provided on the base substrate; a flattening film covering the wiring line; and a light-emitting element provided on the flattening film. The wiring line includes a layered structure in which a first conductive layer, a second conductive layer, and a third conductive layer are layered sequentially from the base substrate side. In the wiring line, the second conductive layer is formed with a width smaller than a width of each of the first conductive layer and the third conductive layer, and a portion of a perimeter edge surface corresponding to the second conductive layer includes a recessed portion recessed inward of the wiring line, and the wiring line is exposed, including the perimeter edge surface, from the flattening film. A resin cover covering a perimeter edge surface of the second conductive layer is provided in the recessed portion in a portion of the wiring line exposed from the flattening film, and the resin cover has a thickness smaller than a thickness of the wiring line. Here, the "thickness of the resin cover" and the "thickness of the wiring line" refer to the thickness in the layering direction of the first conductive layer, the second conductive layer, and the third conductive layer that constitutes the wiring line.

In addition, a method for manufacturing a display device according to the techniques of the present disclosure includes: a wiring line forming step of forming a wiring line on a base substrate, the wiring line including a layered structure in which a first conductive layer, a second conductive layer, and a third conductive layer are sequentially layered, and the wiring line being provided with a recessed portion in a portion of a perimeter edge surface corresponding to the second conductive layer, the recessed portion being recessed inward of the wiring line; and a resin cover forming step of forming a resin cover covering a perimeter edge surface of the second conductive layer of the wiring line. The resin cover forming step includes a film forming step of forming, by vapor deposition, a resin film covering the wiring line, and an ashing step of forming the resin cover by ashing a resin film formed at the film forming step, the resin cover having a thickness smaller than a thickness of the wiring line.

Advantageous Effects of Disclosure

According to a display device according to the techniques of the present disclosure, a wiring line is provided in a layered structure in which a first conductive layer, a second conductive layer, and a third conductive layer are sequentially layered and in which a portion corresponding to the second conductive layer include a recessed portion recessed inward of the wiring line, and a resin cover covering a perimeter edge surface of the second conductive layer is provided in the recessed portion and is thinner than the wiring line. Thus, a mounting step of establishing conduction of a mounting component and the wiring line can be performed easily while the second conductive layer is protected by the resin cover in the wiring line.

Additionally, according to a method for manufacturing a display device according to the techniques of the present disclosure, an organic resin film covering a wiring line is formed, and subsequently a resin cover covering an end surface of a second conductive layer in a recessed portion provided in a perimeter edge surface of the wiring line is formed with the thickness of the resin cover smaller than the thickness of the wiring line, by ashing the organic resin film. Thus, a mounting step of establishing conduction of a mounting component to the wiring line can be performed easily while the second conductive layer is protected by the resin cover in the wiring line. Moreover, occurrence of a void in the recessed portion in the organic resin film can be prevented, and reliability of a role of protecting the second conductive layer in the resin cover can be improved.

DESCRIPTION OF EMBODIMENTS

Exemplary embodiments will be described below in detail with reference to the drawings.

First Embodiment

In a first embodiment, an organic EL display device and a method for manufacturing the organic EL display device will be described as an example of a display device and a method for manufacturing the display device according to the techniques of the present disclosure.

Configuration of Organic EL Display Device

Figure 1:
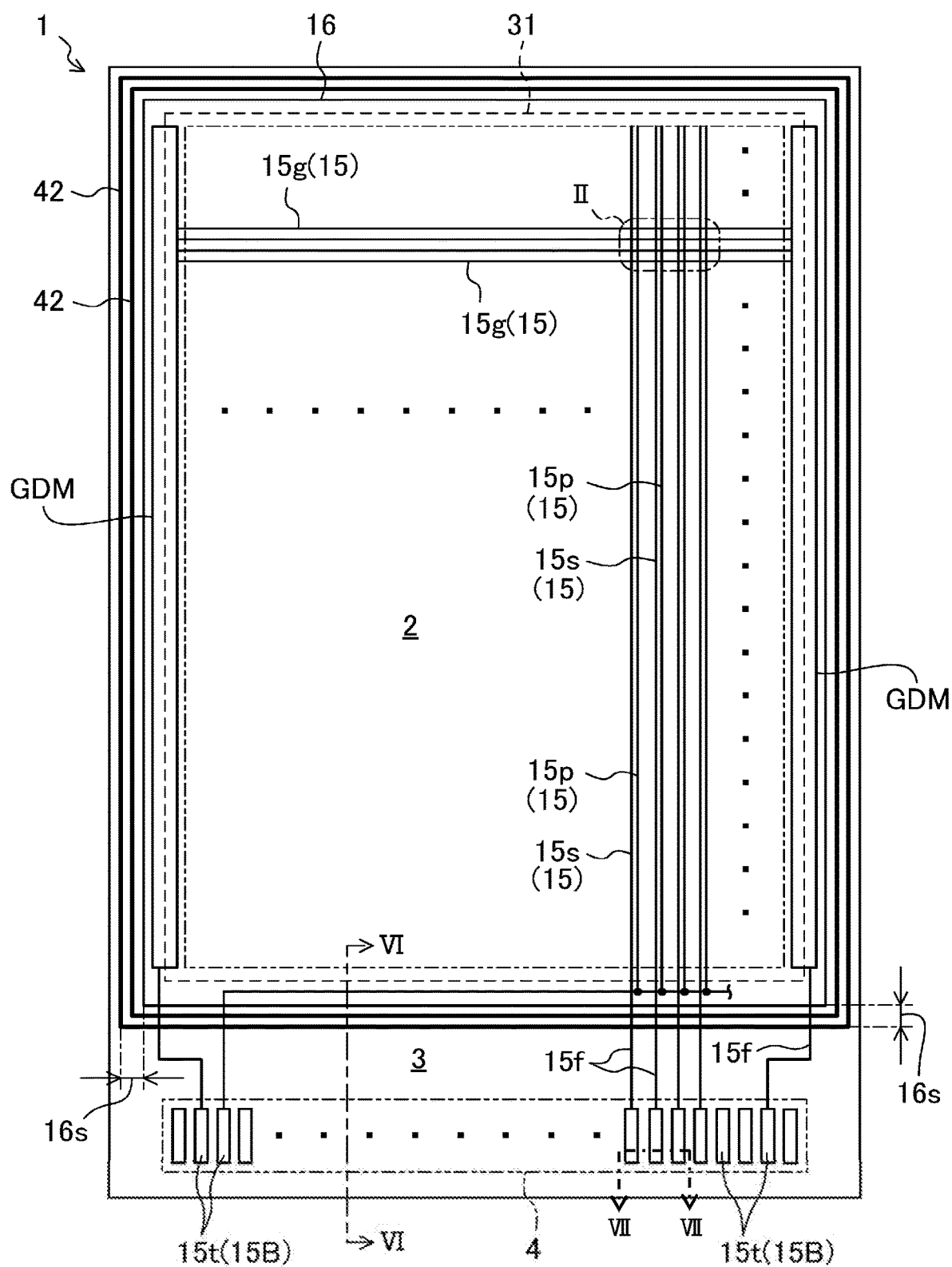
FIG. 1 is a plan view illustrating a schematic configuration of an organic EL display device according to a first embodiment.
Figure 2:
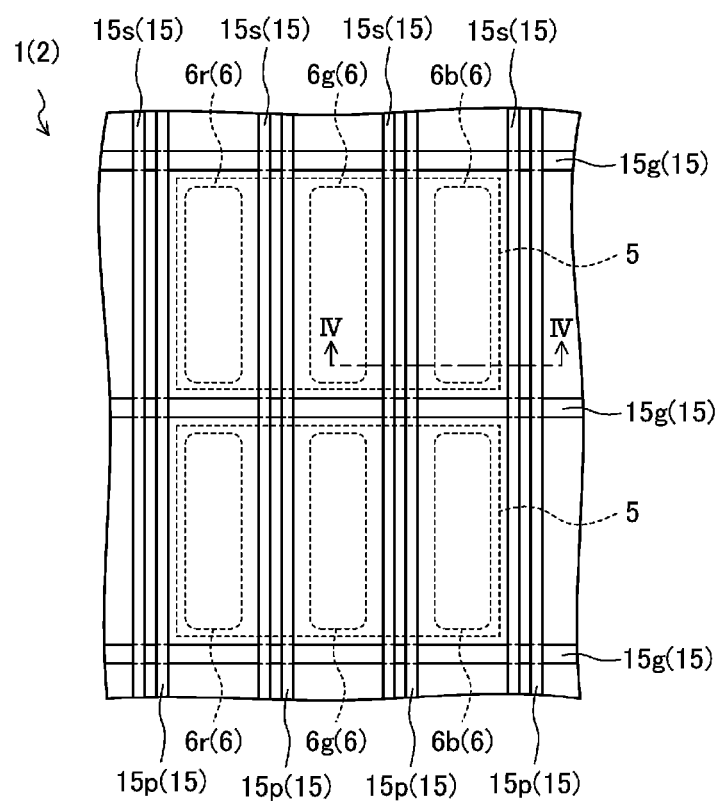
FIG. 2 is a plan view of a portion surrounded by II in a display region of the organic EL display device of FIG. 1.
Figure 3:
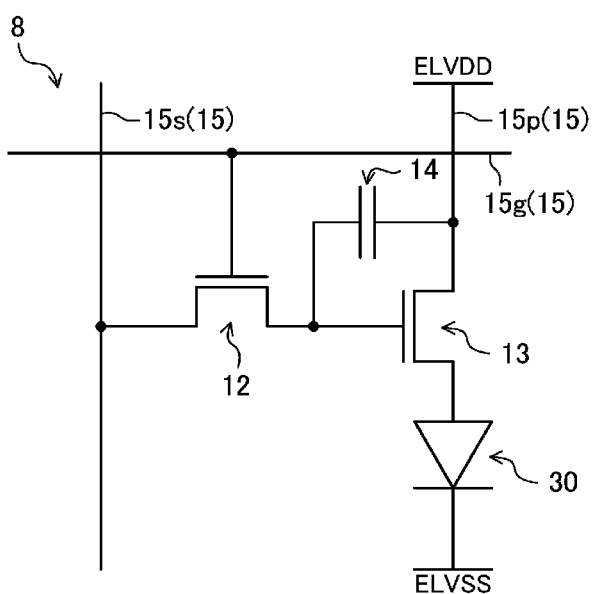
FIG. 3 is an equivalent circuit diagram of a portion of a TFT layer constituting the organic EL display device according to the first embodiment.
Figure 4:
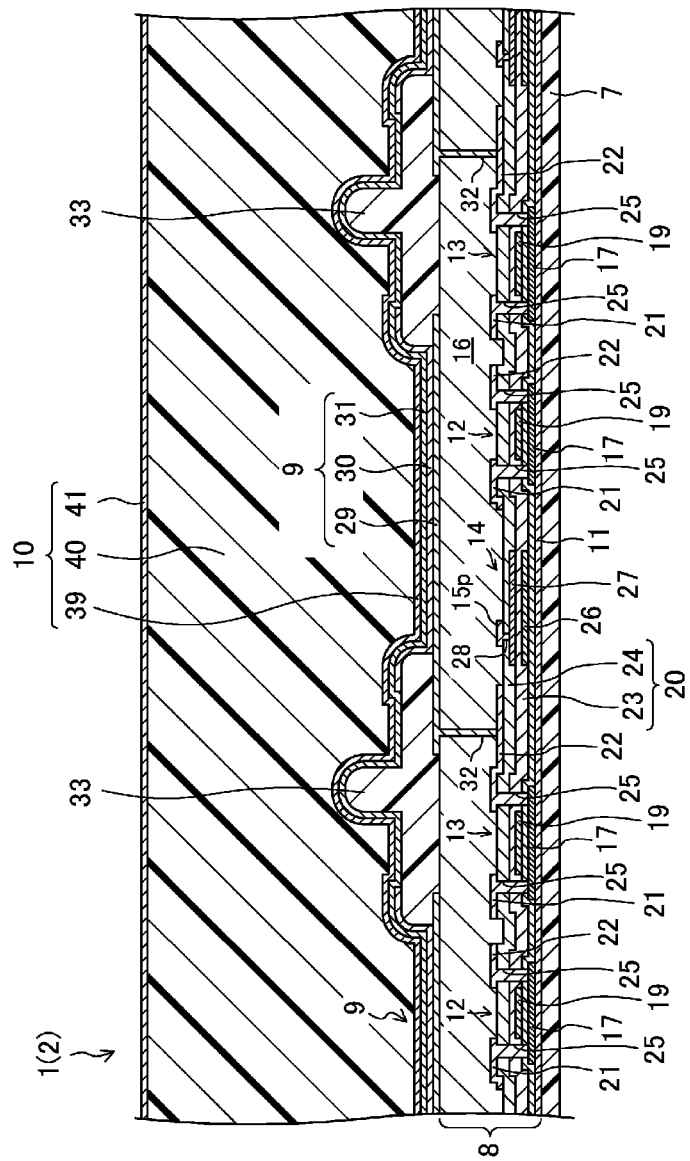
FIG. 4 is a cross-sectional view taken along line IV-IV in the display region of the organic EL display device of FIG. 2.
Figure 5:
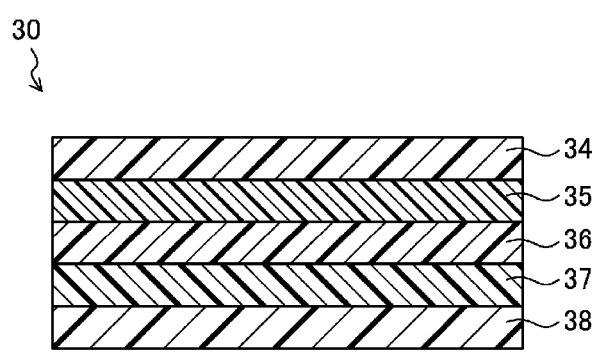
FIG. 5 is a cross-sectional view illustrating a configuration of an organic EL layer constituting the organic EL display device according to the first embodiment.
Figure 6:
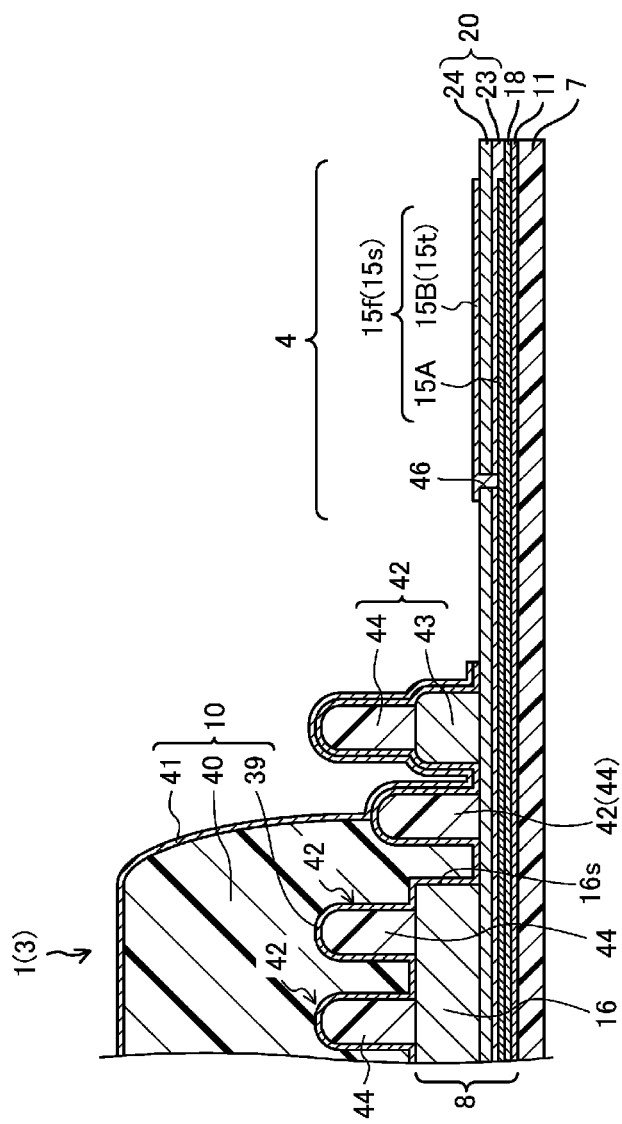
FIG. 6 is a cross-sectional view taken along line VI-VI in a frame region including a terminal section of the organic EL display device of FIG. 1.
Figure 7:
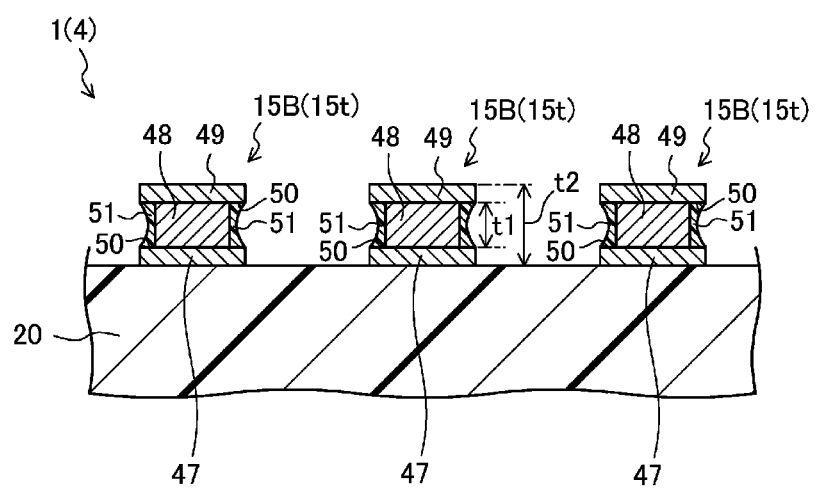
FIG. 7 is a cross-sectional view taken along line VII-VII and illustrating a main portion of the terminal section of the organic EL display device of FIG. 1.

An organic EL display device 1 according to the first embodiment will be described with reference to FIGS. 1 to 7. FIG. 1 is a plan view illustrating a schematic configuration of the organic EL display device 1. FIG. 2 is a plan view of a portion surrounded by II in a display region 2 of the organic EL display device 1 of FIG. 1. FIG. 3 is an equivalent circuit diagram of a portion of a TFT layer 8 constituting the organic EL display device. FIG. 4 is a cross-sectional view taken along line IV-IV in the display region 2 of the organic EL display device 1 of FIG. 2. FIG. 5 is a cross-sectional view illustrating a configuration of an organic EL layer 30 constituting the organic EL display device 1. FIG. 6 is a cross-sectional view taken along line VI-VI in a frame region 3 including a terminal section 4 of the organic EL display device 1 of FIG. 1. FIG. 7 is a cross-sectional view taken along line VII-VII and illustrating a main portion of the terminal section 4 of the organic EL display device 1 of FIG. 1.

As illustrated in FIG. 1, the organic EL display device 1 includes the display region 2 provided in a rectangular shape in which an image is displayed, and the frame region 3 having a rectangular frame shape and provided in a periphery of the display region 2. Moreover, the terminal section 4 for connecting to an external circuit is provided in a portion constituting one side of the frame region 3. Though not illustrated, one end portion of a flexible printed circuit (FPC) is connected to the terminal section 4. The FPC is an example of a mounting component to be mounted on the organic EL display device 1.

Further, a gate driver circuit GDM is provided on a substrate (resin substrate layer 7 described below) in a monolithic manner in portions of the frame region 3 constituting sides (two sides on the right and the left in FIG. 1) adjacent to the side in which the terminal section 4 is provided. In addition, a plurality of frame wiring lines 15$f$ are provided between the display region 2 and the terminal section 4 in the frame region 3. Each of the frame wiring lines 15$f$ constitutes a wiring line terminal 15$t$ to be connected to an FPC at the terminal section 4. A plurality of the wiring line terminals 15$t$ are arranged in a predetermined pattern in the terminal section 4.

The organic EL display device 1 employs an active matrix driving method. A plurality of pixels 5 illustrated in FIG. 2 are disposed in a matrix shape in the display region 2. Each of the pixels 5 includes subpixels 6 of three colors of, for example, a subpixel 6$r$ that performs red gray scale display, a subpixel 6$g$ that performs green gray scale display, and a subpixel 6$b$ that performs blue gray scale display. The subpixels 6r, 6g, and 6b of the three colors are arranged, for example, in juxtaposition and are adjacent to each other in a stripe shape.

As illustrated in FIG. 4, the organic EL display device 1 includes a resin substrate layer 7 as a base substrate, a thin film transistor (TFT) layer 8 provided on the resin substrate layer 7; a plurality of organic EL elements 9 provided as light-emitting elements on the TFT layer 8, and a sealing film 10 covering the plurality of organic EL elements 9.

The resin substrate layer 7 is an example of a resin substrate and is formed of, for example, a polyimide resin or the like, and the resin substrate layer 7 has flexibility.

The TFT layer 8 includes a base coat film 11 provided on the resin substrate layer 7, a plurality of first TFTs 12, a plurality of second TFTs 13, a plurality of capacitors 14, and various display wiring lines 15 that are provided on the base coat film 11, and a flattening film 16 provided to cover the plurality of first TFTs 12, the plurality of second TFTs 13, the plurality of capacitors 14, and the display wiring lines 15.

The base coat film 11 includes, for example, a single-layer film or a layered film of an inorganic insulating film made of silicon nitride, silicon oxide, silicon oxynitride, or the like. Each of the first TFTs 12, the second TFTs 13, and the capacitors 14 is provided in each of the subpixels 6.

As illustrated in FIGS. 2 and 3, a plurality of gate wiring lines 15g that transmit a gate signal, a plurality of source wiring lines 15s that transmit a source signal, and a plurality of power source wiring lines 15p that supply current to the organic EL elements 9 are provided as the display wiring lines 15. The plurality of gate wiring lines 15g extend parallel to each other. The plurality of source wiring lines 15s extend parallel to each other in a direction intersecting with the gate wiring lines 15g. The plurality of power source wiring lines 15p extend parallel to each other and along the source wiring lines 15s. The gate wiring lines 15g, the source wiring lines 15s, and the power source wiring lines 15p are insulated from one another, and are formed in a lattice shape as a whole to partition each of the subpixels 6.

Each of the source wiring lines 15s and each of the power source wiring lines 15p are led out as the frame wiring lines 15f from the display region 2 to the terminal section 4. Each of the gate wiring lines 15g is connected to the gate driver circuit GDM. The gate driver circuit GDM is connected to the frame wiring lines 15f and is configured to receive a drive signal via the frame wiring lines 15f and sequentially drive the gate wiring lines 15g.

The first TFT 12 and the second TFT 13 are an example of active elements, and employ, for example, a top gate type structure. Specifically, as illustrated in FIG. 4, each of the first TFT 12 and the second TFT 13 includes a semiconductor layer 17 provided in an island shape on the base coat film 11, a gate insulating film 18 covering the semiconductor layer 17, a gate electrode 19 overlapped with a portion of the semiconductor layer 17 (channel region) via the gate insulating film 18, an interlayer insulating film 20 covering the gate electrode 19, and a source electrode 21 and a drain electrode 22 that are provided on the interlayer insulating film 20.

The gate electrode 19 is integrally formed of the same material and in the same layer as a material and a layer of the gate wiring line 15g. That is, the gate wiring line 15g is provided on the gate insulating film 18. The interlayer insulating film 20 is provided in a lower layer of the flattening film 16 on the resin substrate layer 7, and includes a layered film of a first interlayer insulating film 23 and a second interlayer insulating film 24. The first interlayer insulating film 23 and the second interlayer insulating film 24, and the gate insulating film 18 each include, for example, an inorganic insulating film of silicon nitride, silicon oxide, silicon oxynitride, or the like.

The source electrode 21 and the drain electrode 22 are separated from each other and are respectively connected to different portions (a source region and a drain region) of the semiconductor layer 17 via contact holes 25 formed in the gate insulating film 18 and the interlayer insulating film 20. The source electrode 21 and the drain electrode 22 are integrally formed of the same material and in the same layer as a material and a layer of the source wiring line 15s in the display region 2. In addition, the power source wiring line 15p is also integrally formed of the same material and in the same layer as the material and the layer of the source wiring line 15s in the display region 2.

That is, the source wiring line 15s and the power source wiring line 15p are located in an upper layer of the interlayer insulating film 20 in the display region 2, and are covered by the flattening film 16. Although not illustrated, the source wiring line 15s, the power source wiring line 15p, the source electrode 21, and the drain electrode 22 in the display region 2 each include the same layered structure (Ti layer/Al layer/Ti layer) as a wiring line upper layer portion 15B described below and constituting the frame wiring line 15f.

The gate electrode 19 of the first TFT 12 is connected to the gate wiring line 15g partitioning the corresponding subpixel 6. The source electrode 21 of the first TFT 12 is connected to the source wiring line 15s partitioning the corresponding subpixel 6. The drain electrode 22 of the first TFT 12 is connected to the gate electrode 19 of the second TFT 13. The source electrode 21 of the second TFT 13 is connected to the power source wiring line 15p partitioning the corresponding subpixel 6.

The capacitor 14 is connected to the first TFT 12 of the corresponding subpixel 6 and to the power source wiring line 15p partitioning the corresponding subpixel 6. The capacitor 14 includes a lower conductive layer 26 provided on the gate insulating film 18, the first interlayer insulating film 23 covering the lower conductive layer 26, and an upper conductive layer 27 overlapped via the first interlayer insulating film 23 with the lower conductive layer 26. The lower conductive layer 26 is formed of the same material and in the same layer as a material and a layer of the gate electrode 19. The upper conductive layer 27 is connected to the power source wiring line 15p via a contact hole 28 formed in the second interlayer insulating film 24.

The flattening film 16 covers portions other than a portion of the drain electrode 22 of the second TFT 13 in the display region 2, and thus a surface of the TFT layer 8 is flattened such that surface shapes of the source wiring line 15s, the power source wiring line 15p, the first TFT 12, and the second TFT 13 are not reflected. The flattening film 16 is formed of, for example, a colorless transparent organic resin material such as an acrylic resin.

The organic EL element 9 is provided in each of the subpixels 6 on the flattening film 16. The organic EL element 9 employs a top-emitting structure. Specifically, the organic EL element 9 includes a first electrode 29 provided on a surface of the flattening film 16, an organic EL layer 30 as a function layer provided on the first electrode 29, and a second electrode 31 overlapped via the organic EL layer 30 with the first electrode 29.

The first electrode 29 is provided for each of the organic EL elements 9, and a plurality of the first electrodes 29 are disposed in a matrix shape. Each of the first electrodes 29 is connected to the drain electrode 22 of the second TFT 13 in the corresponding subpixel 6 via a contact hole 32 formed in the flattening film 16. The first electrode 29 functions to inject a positive hole (hole) into the organic EL layer 30. The first electrode 29 is preferably formed of a material having a large work function to improve hole injection efficiency into the organic EL layer 30.

Examples of a material of the first electrode 29 include a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

Further, the material of the first electrode 29 may be, for example, an alloy of magnesium (Mg) and copper (Cu), magnesium (Mg) and silver (Ag), sodium (Na) and potassium (K), astatine (At) and astatine oxide ($AtO_2$), lithium (Li) and aluminum (Al), lithium (Li), calcium (Ca) and aluminum (Al), and lithium fluoride (LiF), calcium (Ca) and aluminum (Al).

In addition, the material of the first electrode 29 may be, for example, an electrically conductive oxide such as tin oxide (SnO), zinc oxide (ZnO), indium tin oxide (ITO), and indium zinc oxide (IZO). In addition, the first electrode 29 may be formed of a plurality of layers made of the materials described above and layered on one another. Note that, examples of the material having a large work function include indium tin oxide (ITO), and indium zinc oxide (IZO).

The first electrodes 29 of the subpixels 6 adjacent to each other are partitioned by an edge cover 33. The edge cover 33 is formed in a lattice shape and covers a peripheral portion of each of the first electrodes 29. Examples of a material of the edge cover 33 include an inorganic compound such as silicon oxide, silicon nitride, and silicon oxynitride, and an organic resin material such as a polyimide resin, an acrylic resin, a polysiloxane resin, and a novolac resin.

The organic EL layer 30 is provided for each of the organic EL elements 9. The organic EL layer 30 includes a structure in which a hole injection layer 34, a hole transport layer 35, a light-emitting layer 36, an electron transport layer 37, and an electron injection layer 38 illustrated in FIG. 5 are layered in that order on the first electrode 29.

The hole injection layer 34 is also referred to as an anode electrode buffer layer, and functions to reduce an energy level difference between the first electrode 29 and the organic EL layer 30 and to improve efficiency of hole injection into the organic EL layer 30 from the first electrode 29. Examples of a material of the hole injection layer 34 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 35 functions to improve hole transport efficiency from the first electrode 29 to the organic EL layer 30. Examples of a material of the hole transport layer 35 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 36 functions to, when a voltage is applied by the first electrode 29 and the second electrode 31, recombine a positive hole injected from the first electrode 29 with an electron injected from the second electrode 31 and emit light. The light-emitting layer 36 is formed of a different material in each of the subpixels 6 in accordance with luminescent color (for example, red, green, or blue) of the organic EL element 9.

Examples of a material of the light-emitting layer 36 include a metal oxinoid compound [8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, a benzthiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidin derivative, phenoxazone, a quinacridone derivative, rubrene, poly-p-phenylenevinylene, and polysilane.

The electron transport layer 37 functions to facilitate migration of an electron to the light-emitting layer 36 efficiently. Examples of a material of the electron transport layer 37 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound as an organic compound.

The electron injection layer 38 is also referred to as a cathode electrode buffer layer, and functions to reduce an energy level difference between the second electrode 31 and the organic EL layer 30 and to improve electron injection efficiency from the second electrode 31 into the organic EL layer 30. Examples of a material of the electron injection layer 38 include an inorganic alkaline compound such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 31 is provided in common to the plurality of organic EL elements 9 (namely, in common to the plurality of subpixels 6), and covers the organic EL layer 30. Although not illustrated, the second electrode 31 is connected to the frame wiring line 15f, and conduction with the external circuit is established through the frame wiring line 15f at the wiring line terminal 15t provided in the terminal section 4. The second electrode 31 preferably has a function to inject an electron into the organic EL layer 30, and is preferably formed of a material having a small work function to improve efficiency of electron injection into the organic EL layer 30.

Examples of a material of the second electrode 31 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

In addition, the material of the second electrode 31 may be, for example, an alloy of magnesium (Mg) and copper (Cu), an alloy of magnesium (Mg) and silver (Ag), an alloy of sodium (Na) and potassium (K), an alloy of astatine (At) and astatine oxide ($AtO_2$), an alloy of lithium (Li) and aluminum (Al), an alloy of lithium (Li), calcium (Ca) and aluminum (Al), and an alloy of lithium fluoride (LiF), calcium (Ca) and aluminum (Al).

In addition, the material of the second electrode 31 may be an electrically conductive oxide such as tin oxide (SnO), zinc oxide (ZnO), indium tin oxide (ITO), and indium zinc oxide (IZO). In addition, the second electrode 31 may be formed of a plurality of layers made of the materials described above and layered on one another. Note that, examples of the material having a small work function include magnesium (Mg), lithium (Li), lithium fluoride (LiF), an alloy of magnesium (Mg) and copper (Cu), an alloy of magnesium (Mg) and silver (Ag), an alloy of sodium (Na) and copper (Cu), an alloy of sodium (Na) and potassium (K), an alloy of lithium (Li) and aluminum (Al), an alloy of lithium (Li), calcium (Ca) and aluminum (Al), and an alloy of lithium fluoride (LiF), calcium (Ca) and aluminum (Al).

The sealing film 10 functions to protect the organic EL element 9 from moisture, oxygen, or the like. As illustrated in FIGS. 4 and 6, the sealing film 10 includes a first inorganic layer 39 covering the second electrode 31, an organic layer 40 provided on the first inorganic layer 39, and a second inorganic layer 41 covering the organic layer 40.

The first inorganic layer 39 and the second inorganic layer 41 are formed of, for example, an inorganic material such as silicon oxide ($SiO_2$), aluminum oxide ($Al_2O_3$), and silicon carbonitride ($Si_3N_4$). The organic layer 40 is formed of, for example, an organic resin material such as acrylate, an epoxy resin, a silicon resin, polyurea, parylene, polyimide, and polyamide.

The first inorganic layer 39, the organic layer 40, and the second inorganic layer 41 are provided in all the display region 2, and are also provided in the frame region 3. Circumferential end edges of the first inorganic layer 39, the organic layer 40, and the second inorganic layer 41 are positioned in the frame region 3. As illustrated in FIG. 6, the circumferential end edge of the organic layer 40 is positioned in the display region 2 side in the frame region 3, as compared with the circumferential end edges of the first inorganic layer 39 and the second inorganic layer 41.

In addition, in a manufacturing process of the organic EL display device 1, a plurality of dam walls 42 are provided in the frame region 3 into a frame shape surrounding the display region 2 to dam expansion of the organic resin material serving as the organic layer 40.

Each of the dam walls 42 includes a layered structure of a first wall layer 43 and a second wall layer 44 or includes the second wall layer 44 only. The first wall layer 43 is formed of the same material and in the same layer as a material and a layer of the flattening film 16. The second wall layer 44 is formed of the same material and in the same layer as a material and a layer of the edge cover 33. In the example illustrated in FIG. 6, the dam wall 42 located in an outermost periphery includes a layered structure of the first wall layer 43 and the second wall layer 44. A slit 16s in which the interlayer insulating film 20 is exposed from a layer formed of the same film as the flattening film 16 is formed between the dam wall 42 and the flattening film 16, namely, in an outer periphery of the flattening film 16.

The first inorganic layer 39 and the second inorganic layer 41 cover all of the dam walls 42. Circumferential end edge portions of the first inorganic layer 39 and the second inorganic layer 41 are connected to each other at least in a portion covering the dam wall 42 located in the outermost periphery, and in the outer side of the portion. That is, the organic layer 40 is enclosed by the first inorganic layer 39 and the second inorganic layer 41, and is encapsulated between the first inorganic layer 39 and the second inorganic layer 41.

In addition, the plurality of frame wiring lines 15f electrically connected in the frame region 3 to the source wiring lines 15s in the display region 2, namely, the frame wiring lines 15f constituting the respective source wiring lines 15s are led out from the display region 2 to the terminal section 4 via a lower layer of the flattening film 16 and the dam walls 42. Each of the frame wiring lines 15f extends in a direction intersecting with the slit 16s, and is formed to transverse the slit 16s.

As illustrated in FIG. 6, each of the frame wiring lines 15f includes a wiring line lower layer portion 15A provided in a lower layer of the interlayer insulating film 20 and the wiring line upper layer portion 15B provided in an upper layer of the interlayer insulating film 20.

The wiring line lower layer portion 15A is formed on the gate insulating film 18 and is formed of the same material and in the same layer as a material and a layer of the gate electrode 19, and constitutes all the portion of the frame wiring line 15f extending from the display region 2 to the terminal section 4. That is, the wiring line lower layer portion 15A passes through a gap between the gate insulating film 18 and the interlayer insulating film 20 and is led out between the display region 2 and the terminal section 4 in the frame region 3. Thus, the frame wiring line 15f is protected from moisture, oxygen, or the like by the interlayer insulating film 20 extending over a large portion of the frame wiring line 15f.

On the other hand, the wiring line upper layer portion 15B is formed of the same material and in the same layer as a material and layer of the source electrode 21 and the drain electrode 22, and is located in the terminal section 4. The wiring line upper layer portion 15B is connected via a contact hole 46 formed in the interlayer insulating film 20 to a lead-out end portion of the wiring line lower layer portion 15A located at the terminal section 4. Moreover, the wiring line upper layer portion 15B is exposed entirely including a perimeter edge surface, from the flattening film 16, and constitutes the wiring line terminal 15t at the terminal section 4.

As illustrated in FIG. 7, the wiring line terminal 15t (wiring line upper layer portion 15B) includes a layered structure in which a first conductive layer 47, a second conductive layer 48, and a third conductive layer 49 are layered on the interlayer insulating film 20 sequentially from the resin substrate layer 7 side. The first conductive layer 47 and the third conductive layer 49 are each formed of titanium (Ti). The second conductive layer 48 is formed of aluminum (Al). In the wiring line terminal 15t including such a three-layer structure, the second conductive layer 48 has a width smaller than the width of each of the first conductive layer 47 and the third conductive layer 49. Accordingly, the wiring line terminal 15t includes a recessed portion 50 in which a portion of the perimeter edge surface corresponding to the second conductive layer 48 is recessed inward of the wiring line terminal 15t.

Moreover, a resin cover 51 covering the perimeter edge surface of the second conductive layer 48 is provided in the recessed portion 50 of the wiring line terminal 15t. The resin cover 51 is separated for each of the wiring line terminals 15t adjacent to each other. A thickness t1 of the resin cover 51 is smaller than a thickness t2 of the wiring line terminal 15t (source wiring line 15s), and an outermost surface of the resin cover 51 is positioned at the lateral side of the wiring line terminal 15t. Specifically, in the first embodiment, the resin cover 51 is formed only in the recess 50, and a surface facing the lateral side of the wiring line terminal 15t is formed in a shape curved inward of the recessed portion 50.

The resin cover 51 described above is formed of, for example, an organic resin material such as acrylate, polyurea, parylene, polyimide, and polyamide. The second conductive layer 48 is protected by such a resin cover 51. Moreover, the wiring line terminal 15t is provided openly without being covered by other layers such as the flattening film 16. Conduction of an FPC to be mounted on the terminal section 4 to the display wiring line 15 is established in the wiring line upper layer portions 15B serving as the wiring line terminals 15t.

In the organic EL display device 1 including the configuration described above, in each of the subpixels 6, a gate signal is input via the gate wiring line 15g to the first TFT 12 and thus the first TFT 12 is brought into an on state, and a predetermined voltage corresponding to a source signal is written via the source wiring line 15s in the gate electrode 19 of the second TFT 13 and the capacitor 14 to supply current based on a gate voltage of the second TFT 13 from the power source wiring line 15p to the organic EL element 9, and thus the light-emitting layer 36 of the organic EL layer 30 emits light, and an image is displayed. Note that in the organic EL display device 1, even when the first TFT 12 is brought into an off state, a gate voltage of the second TFT 13 is held by the capacitor 14, and thus light emitted from the organic EL layer 30 (light-emitting layer 36) is maintained for each of the subpixels 6 until a gate signal of the next frame is input.

Method for Manufacturing Organic EL Display Device

Figure 8:
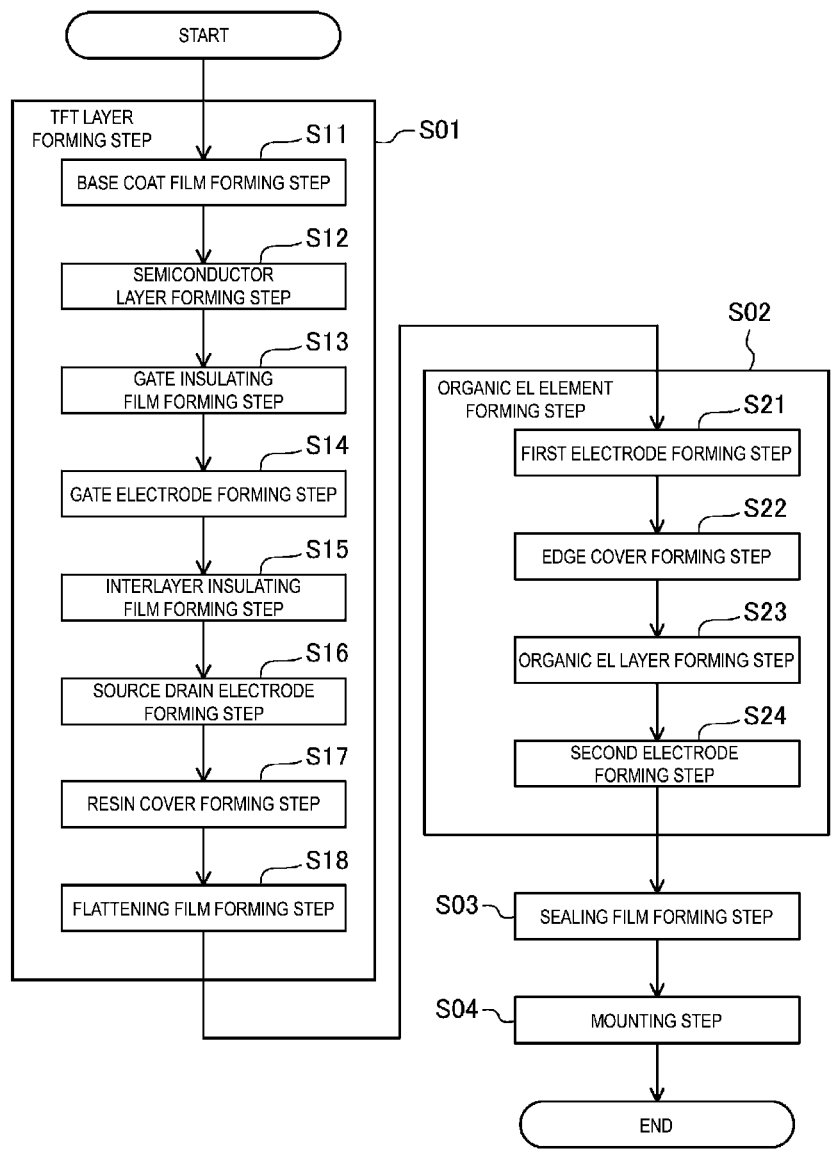
FIG. 8 is a flow chart illustrating a method for manufacturing the organic EL display device according to the first embodiment.
Figure 9:
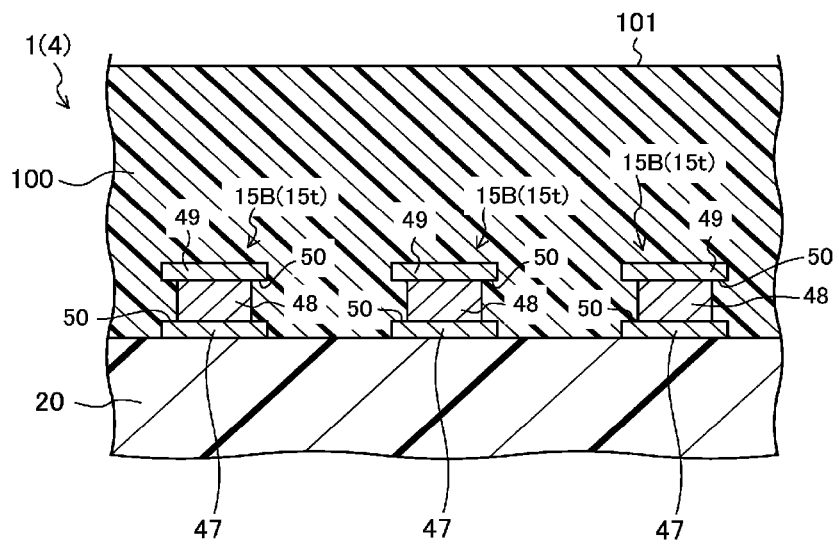
FIG. 9 is a cross-sectional view illustrating a state of a main portion in which an organic resin film is formed at a resin cover forming step in the method for manufacturing the organic EL display device according to the first embodiment.
Figure 10:
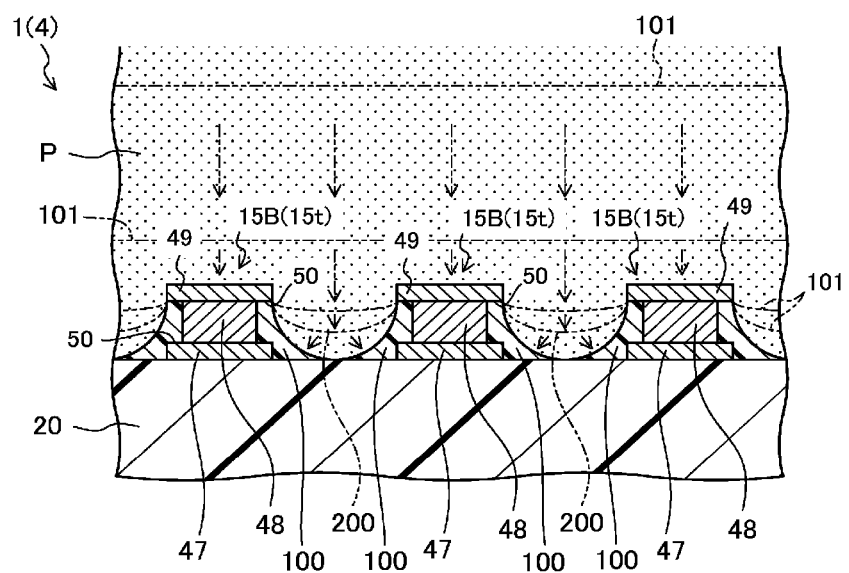
FIG. 10 is a cross-sectional view illustrating a state of a main portion at the time of ashing at the resin cover forming step in the method for manufacturing the organic EL display device according to the first embodiment.

A method for manufacturing the organic EL display device 1 will be described with reference to FIGS. 8 to 10. FIG. 8 is a flow chart illustrating a method for manufacturing the organic EL display device 1. FIG. 9 is a cross-sectional view illustrating a state of a main portion in which an organic resin film 100 is formed at a resin cover forming step S17 in the method for manufacturing the organic EL display device 1. FIG. 10 is a cross-sectional view illustrating a state of a main portion at the time of ashing at the resin cover forming step S17 in the method for manufacturing the organic EL display device 1.

As illustrated in FIG. 8, the method for manufacturing the organic EL display device 1 includes a TFT layer forming step S01, an organic EL element forming step S02, a sealing film forming step S03, and a mounting step S04.

The TFT layer forming step S01 includes a base coat film forming step S11, a semiconductor layer forming step S12, a gate insulating film forming step S13, a gate electrode forming step S14, an interlayer insulating film forming step S15, a source drain electrode forming step S16, the resin cover forming step S17, and a flattening film forming step S18. Here, the base coat film forming step S11, the gate insulating film forming step S13, and the interlayer insulating film forming step S15 correspond to an inorganic film forming step. In addition, the gate electrode forming step S14 and the source drain electrode forming step S16 correspond to a wiring line forming step of forming various types of the display wiring lines 15 (the gate wiring line 15g, the source wiring line 15s, the power source wiring line 15p).

First, at the base coat film forming step S11, an inorganic insulating film such as a silicon nitride film, a silicon oxide film, and a silicon oxynitride film is formed, for example, by a chemical vapor deposition (CVD) method in a single-layer film or in a layered film on a surface of the resin substrate layer 7 formed on a glass substrate, and the base coat film 11 is formed.

Next, at the semiconductor layer forming step S12, a semiconductor film is formed, for example, by the CVD method on the substrate on which the base coat film 11 is formed, and a crystallization treatment or a lowering resistance treatment is applied to the semiconductor film as necessary. Subsequently, a photolithography treatment (resist coating, prebaking, exposure, development, postbaking, etching, and resist peeling) is performed on the semiconductor film to pattern the semiconductor film, and thus the semiconductor layer 17 is formed.

Next, at the gate insulating film forming step S13, an inorganic insulating film such as a silicon nitride film, a silicon oxide film, and a silicon oxynitride film is formed, for example, by a CVD method in a single-layer film or in a layered film on the substrate on which the semiconductor layer 17 is formed, and the gate insulating film 18 is formed.

Next, at the gate electrode forming step S14, a layered conductive film is formed by sequentially forming a titanium film, an aluminum film, and a titanium film, for example, by a sputtering method on the substrate on which the gate insulating film 18 is formed. Subsequently, a photolithography treatment is performed on the layered conductive film to pattern the layered conductive film, and thus the gate electrode 19 is formed. At this time, the gate wiring line 15g and the wiring line lower layer portion 15A of the frame wiring line 15f constituting the source wiring line 15s and the power source wiring line 15p are formed together from the layered conductive film that forms the gate electrodes 19.

Next, at the interlayer insulating film forming step S15, first, an inorganic insulating film such as a silicon nitride film, a silicon oxide film, and a silicon oxynitride film is formed, for example, by a CVD method on the substrate on which the gate electrode 19 and the like are formed, and the first interlayer insulating film 23 is formed. Subsequently, an inorganic insulating film such as a silicon nitride film, a silicon oxide film, and a silicon oxynitride film is formed, for example, by a CVD method on the first interlayer insulating film 23, and the second interlayer insulating film 24 is formed.

In this manner, the interlayer insulating film 20 in which the first interlayer insulating film 23 and the second interlayer insulating film 24 are layered is formed. Then, a photolithography treatment is performed on the interlayer insulating film 20 to pattern the interlayer insulating film 20, and thus the contact hole 25 is formed. At this time, the contact hole 25 is also formed in the gate insulating film 18.

Next, at the source drain electrode forming step S16, first, a titanium film as a first conductive film, an aluminum film as a second conductive film, and a titanium film as a third conductive film are sequentially formed, for example, by a sputtering method on the substrate on which the interlayer insulating film 20 is formed, and a layered conductive film is formed. Then, a photolithography treatment is performed on the layered conductive film to pattern the layered conductive film, and thus the first conductive layer 47 is formed from the titanium film that is a lower layer, and the third conductive layer 49 is formed from the titanium film that is an upper layer. In addition, the second conductive layer 48 is formed from the aluminum film. Thus, the source electrode 21 and the drain electrode 22 are formed.

At this time, from the layered conductive film that forms the source electrode 21 and the drain electrode 22, the source wiring line 15s and the power source wiring line 15p of the display region 2, and the wiring line upper layer portion 15B constituting the wiring line terminal 15 at the terminal section 4 are formed together. Etching in the photolithography treatment here is, for example, wet etching using a mixture of phosphoric acid, acetic acid, and nitric acid as an etching solution. In such wet etching, the aluminum film is more easily etched by the etching solution than the titanium film. Thus, in the source wiring line 15s, the power source wiring line 15p, the source electrode 21, and the drain electrode 22 in the display region 2 and in the wiring line upper layer portion 15B of the terminal section 4 (hereinafter, referred to as a "wiring line upper layer portion 15B"), a side shift in which the second conductive layer 48 (aluminum layer) becomes thinner than the first conductive layer 47 and the third conductive layer 49 (both are the titanium layers) occurs, and the recessed portion 50 is formed.

Next, at the resin cover forming step S17, an organic resin film 100 such as acrylate is formed, for example, by a vacuum vapor deposition technique to have a thickness of approximately 100 nm to 300 nm on the substrate on which the source electrode 21 and the drain electrode 22 are formed. In the formation of the organic resin film 100 by the vacuum vapor deposition technique, as illustrated in FIG. 9, the material of the organic resin film 100 flows into the recessed portion 50 of the wiring line upper layer portion 15B, and the organic resin film 100 is also appropriately formed in the recessed portion 50. Accordingly, occurrence of a void in the recessed portion 50 in the organic resin film 100 can be prevented.

Next, the organic resin film 100 is partially removed by ashing with the use of, for example, plasma P, and the resin cover 51 is formed in the recessed portion 50 of the wiring line upper layer portion 15B constituting the wiring line terminal 15t of the display wiring line 15. In such ashing, for example, oxygen plasma is used as the plasma P. Here, as illustrated in FIG. 10, the organic resin film 100 is gradually removed from a surface 101 side as ashing progresses, and a large portion of the organic resin film 100 is finally removed by the plasma P. However, a portion of the flattening film 16 remains in the recessed portion 50 of the wiring line upper layer portion 15B, and thus the resin cover 51 is formed and separated for each of the wiring line upper layer portions 15B adjacent to each other.

Next, at the flattening film forming step S18, a photosensitive organic resin film made of an acrylic resin or the like is first formed, for example, by a known coating method such as a spin coating method. Then, prebaking, exposure, development, and postbaking are performed on the organic resin film to pattern the organic resin film, and thus the flattening film 16 is formed. At this time, the first wall layer 43 constituting the dam wall 42 is formed together from the organic resin film that forms the flattening film 16. In addition, the wiring line upper layer portion 15B constituting the wiring line terminal 15t is exposed from the flattening film 16.

In this manner, the TFT layer 8 is formed on the resin substrate layer 7 at the TFT layer forming step S01.

The organic EL element forming step S02 that is performed next includes a first electrode forming step S21, an edge cover forming step S22, an organic EL layer forming step S23, and a second electrode forming step S24.

At the first electrode forming step S21, a layered conductive film is formed by sequentially forming an indium tin oxide (ITO) film, a silver alloy film (MgAg film), and an ITO film, for example, by a sputtering method on the substrate on which the TFT layer 8 is formed. Subsequently, a photolithography treatment is performed on the layered conductive film to pattern the layered conductive film, and thus a plurality of the first electrodes 29 are formed.

Next, at the edge cover forming step S22, for example, a photosensitive acrylic resin is applied on the plurality of first electrodes 29, and subsequently, prebaking, exposure, development, and postbaking are performed on the applied film to pattern the applied film, and thus the edge cover 33 is formed.

At the organic EL layer forming step S23 that is performed next, the hole injection layer 34, the hole transport layer 35, the light-emitting layer 36, the electron transport layer 37, and the electron injection layer 38 are sequentially formed with use of a film forming mask of a fine metal mask (FMM), for example, by a vacuum vapor deposition technique on the substrate on which the edge cover 33 is formed, and the organic EL layer 30 is formed on each of the first electrode 29.

At the second electrode forming step S24 that is performed next, a silver alloy film (MgAg film) is formed with use of a film forming mask of a common metal mask (CMM), for example, by a vacuum vapor deposition technique on the substrate on which the organic EL layer 30 is formed, and the second electrode 31 is formed.

In this manner, at the organic EL element forming step S02, the organic EL element 9 is formed on the TFT layer 8.

Next, at the sealing film forming step S03, first, an inorganic insulating film such as a silicon nitride film, a silicon oxide film, and a silicon oxynitride film is formed in a single-layer film or in a layered film with use of a film forming mask, for example, by a CVD method on the substrate on which the organic EL element 9 is formed, and the first inorganic layer 39 is formed.

Subsequently, an organic resin material such as acrylate is formed, for example, by an ink-jet method on the substrate on which the first inorganic layer 39 is formed, and the organic layer 40 is formed.

Then, an inorganic insulating film such as a silicon nitride film, a silicon oxide film, and a silicon oxynitride film is formed in a single-layer film or in a layered film with use of a film forming mask, for example, by a CVD method on the substrate on which the organic layer 40 is formed, and the second inorganic layer 41 is formed.

In this manner, at the sealing film forming step S03, the sealing film 10 in which the first inorganic layer 39, the organic layer 40, and the second inorganic layer 41 are layered is formed.

Subsequently, at the mounting step S04, an FPC is connected by using a conductive material such as an anisotropic conductive film (ACF) or an anisotropic conductive paste (ACP) to the terminal section 4 of the substrate on which the sealing film 10 is formed, and thus the FPC is mounted with conduction of the FPC and the wiring line terminal 15t being established.

As describe above, the organic EL display device 1 can be manufactured.

According to the organic EL display device 1 according to the first embodiment, the wiring line terminal 15t of the display wiring line 15 includes the configuration where the first conductive layer 47, the second conductive layer 48, and the third conductive layer 49 are layered and a portion corresponding to the second conductive layer 48 includes the recessed portion 50 recessed inward of the display wiring line 15, and the resin cover 51 covering the perimeter edge surface of the second conductive layer 48 is provided in the recessed portion 50. Thus, the second conductive layer 48 of the wiring line terminal 15t is protected by the resin cover 51. Accordingly, a perimeter edge surface of the wiring line terminal 15t may not be covered by the flattening film 16 having a relatively large film thickness.

Moreover, the thickness t1 of the resin cover 51 is smaller than the thickness t2 of the wiring line upper layer portion 15B constituting the wiring line terminal 15t. Thus, the wiring line terminal 15t and the perimeter edge surface of the wiring line terminal 15t can be exposed from the flattening film 16 and can be provided openly while the second conductive layer 48 is protected. Accordingly, a space for establishing conduction in a periphery of the wiring line terminal 15 is ensured, and thus conduction of the wiring line terminal 15 and an FPC can be established easily, and the mounting step S04 can be performed easily. Further, even when force for compression bond of an FPC to the terminal section 4 is weak, the FPC can be mounted. Thus, this is particularly effective in a case where the flexible resin substrate layer 7 having flexibility is employed in a base substrate as in the organic EL display device 1 according to the first embodiment.

In addition, according to the method for manufacturing the organic EL display device 1 according to the first embodiment, the organic resin film 100 covering the wiring line terminal 15t is formed, and subsequently the organic resin film 100 is partially removed by ashing, and thus the resin cover 51 covering the end surface of the second conductive layer 48 in the recessed portion 50 provided in the perimeter edge surface of the wiring line terminal 15t is formed to have the thickness smaller than the thickness of the wiring line terminal 15t. Thus, the mounting step of establishing conduction of an FPC to the wiring line terminal 15t can be realized easily while the second conductive layer 48 is protected by the resin cover 51 of the wiring line terminal 15t. Moreover, according to the method for manufacturing the organic EL display device 1, the organic resin film 100 is formed by a vacuum vapor deposition technique. Thus, the material forming the organic resin film 100 flows into the recessed portion 50 provided in the perimeter edge surface of the wiring line terminal 15t, and the organic resin film 100 is also suitably formed in the recessed portion 50. Accordingly, occurrence of a void in the recessed portion 50 in the organic resin film 100 can be prevented, and reliability of a role of protecting the second conductive layer 48 in the resin cover 51 can be improved.

Second Embodiment

An organic EL display device 1 according to a second embodiment differs from the first embodiment in a configuration of a resin cover 51. Note that, in the following embodiment, regarding the organic EL display device 1 and the method for manufacturing the organic EL display device 1, only a configuration and a procedure different from those of the first embodiment described above will be described. The same configuration will depend on the description of the first embodiment with reference to FIGS. 1 to 10, and detailed descriptions of the same configuration will be omitted.

Figure 11:
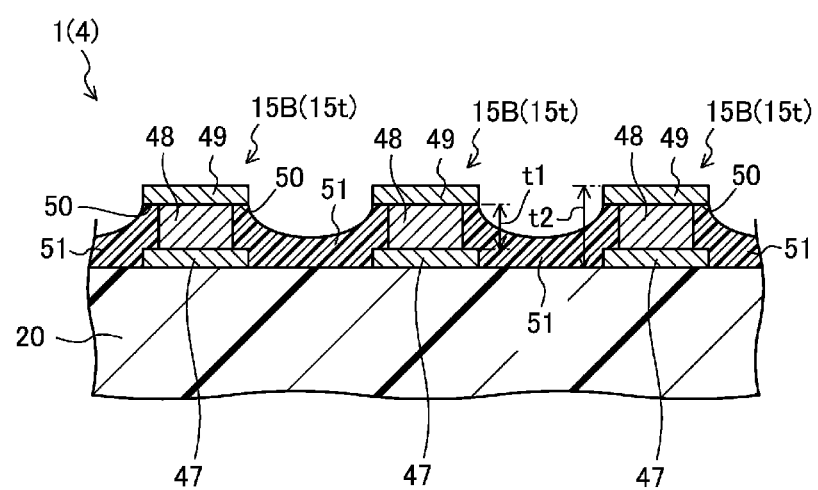
FIG. 11 is a view equivalent to FIG. 7 and illustrating an organic EL display device according to a second embodiment.

FIG. 11 is a view equivalent to FIG. 7 and illustrating the organic EL display device 1 according to the second embodiment. In the organic EL display device 1 according to the first embodiment described above, the resin cover 51 is provided only in the recessed portion 50 and separated for each of the wiring line terminals 15t adjacent to each other. However, the organic EL display device 1 according to the second embodiment, as illustrated in FIG. 11, the resin cover 51 is provided in common between wiring line terminals 15t adjacent to each other, and the resin cover 51 covers a portion of an interlayer insulating film 20 located between the wiring line terminals 15t adjacent to each other. In the second embodiment, a thickness t1 of the resin cover 51 is smaller than a thickness t2 of the wiring line terminal 15t.

At a resin cover forming step S17 in a method for manufacturing the organic EL display device 1, such a resin cover 51 is formed with an upper face of the wiring line terminal 15t, namely, an upper face of the third conductive layer 49 exposed from an organic resin film 100 (resin cover 51) by plasma ashing the organic resin film 100 formed in a frame region 3 until the organic resin film 100 is thinner than the wiring line terminal 15t (for example, until a surface 101 of the organic resin film 100 reaches a position 200 illustrated in FIG. 10).

As with the first embodiment described above, according to the organic EL display device 1 according to the second embodiment, a mounting step S04 of establishing conduction of the wiring line terminal 15t and an FPC can be performed easily while a second conductive layer 48 is protected in the wiring line terminal 15t of a display wiring line 15.

Third Embodiment

Figure 12:
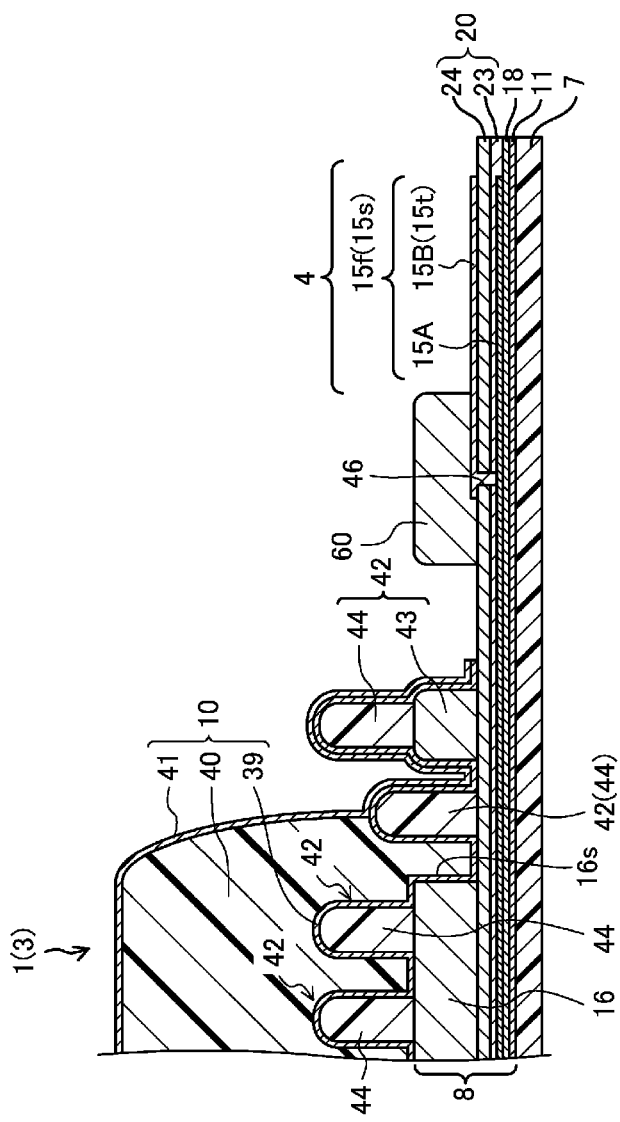
FIG. 12 is a view equivalent to FIG. 6 and illustrating an organic EL display device according to a third embodiment.

FIG. 12 is a view equivalent to FIG. 6 of an organic EL display device 1 according to a third embodiment. The organic EL display device 1 according to the third embodiment differs from the first embodiment in a configuration of a connected portion between a wiring line lower layer portion 15A and a wiring line upper layer portion 15B that constitute a frame wiring line 15f. In the organic EL display device 1, as illustrated in FIG. 12, a portion of the wiring line upper layer portion 15B of the frame wiring line 15f connected to the wiring line lower layer portion 15A is covered by an insulating layer 60.

The insulating layer 60 is formed of the same material and in the same layer as a material and a layer of a flattening film 16, and partially covers a resin cover 51 provided in a recessed portion 50 of a wiring line terminal 15t. At a flattening film forming step S18 in a method for manufacturing the organic EL display device 1, such an insulating layer 60 is formed together with the flattening film 16 from an organic resin film forming the flattening film 16.

According to the organic EL display device 1 according to the third embodiment, a portion of the wiring line upper layer portion 15B of the frame wiring line 15f connected to the wiring line lower layer portion 15A is covered by the insulating layer 60. Thus, moisture or oxygen can be prevented from entering the device 1 through a contact hole 46 for connecting the wiring line lower layer portion 15A and the wiring line upper layer portion 15B. Regarding the rest, the same effects as those of the organic EL display device 1 according to the first embodiment described above can be obtained.

Fourth Embodiment

Figure 13:
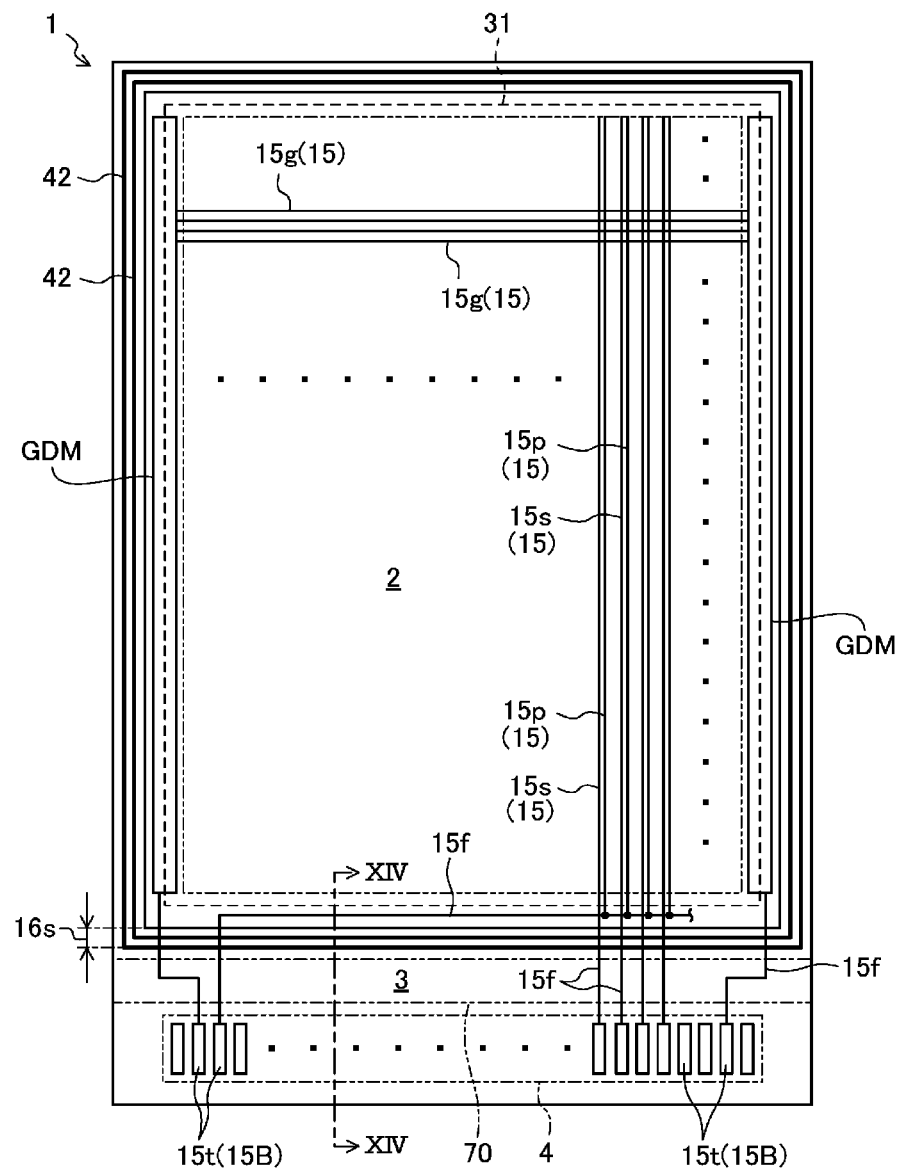
FIG. 13 is a view equivalent to FIG. 1 and illustrating an organic EL display device according to a fourth embodiment.
Figure 14:
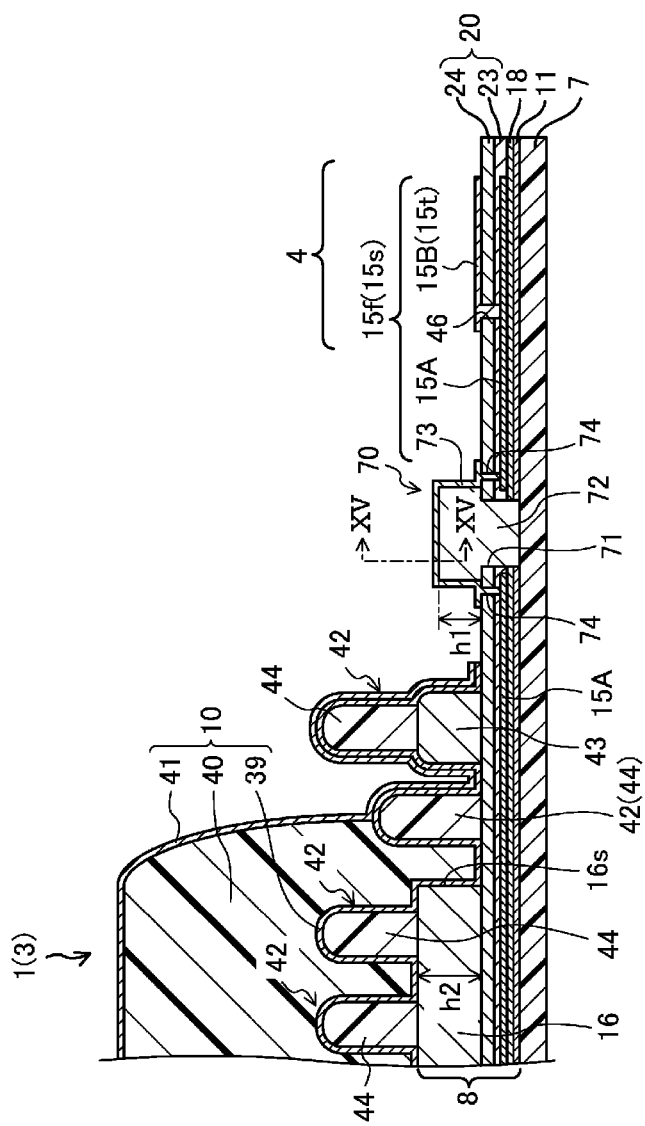
FIG. 14 is a cross-sectional view taken along line XIV-XIV in a frame region including a terminal section of the organic EL display device of FIG. 13.
Figure 15:
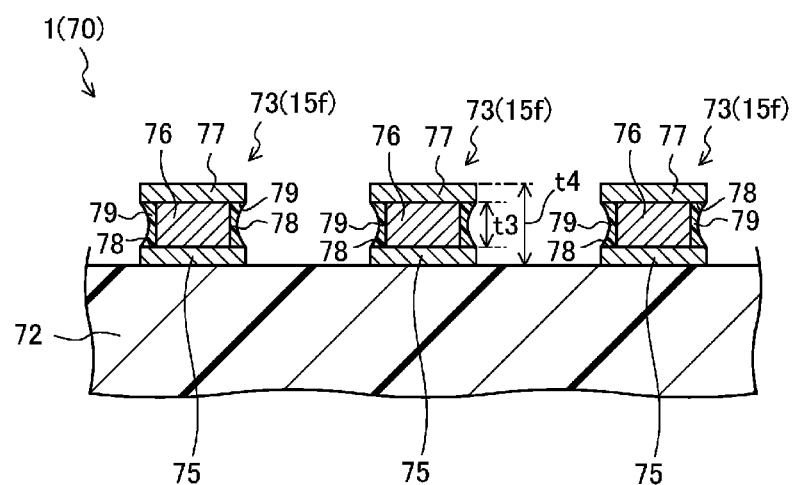
FIG. 15 is a cross-sectional view taken along line XV-XV and illustrating a main portion of a bendable portion of the organic EL display device of FIG. 14.

FIG. 13 is a view equivalent to FIG. 1 of an organic EL display device 1 according to a fourth embodiment. FIG. 14 is a cross-sectional view taken along line XIV-XIV of a frame region 3 including a terminal section 4 of the organic EL display device 1 of FIG. 13. FIG. 15 is a cross-sectional view taken along line XV-XV and illustrating a main portion of a bendable portion 70 of the organic EL display device 1 of FIG. 14. The organic EL display device 1 according to the fourth embodiment differs from the first embodiment in a configuration between a display region 2 and a terminal section 4 in the frame region 3. In the organic EL display device 1, as illustrated in FIGS. 13 and 14, the bendable portion 70 that is more easily bendable than other portions is provided between the display region 2 and the terminal section 4 in the frame region 3 to extend along the terminal section 4 from one end to the other end of the frame region 3.

In the bendable portion 70, a slit 71 that is linear is formed in an inorganic layer provided on a resin substrate layer 7, namely, in an interlayer insulating film 20, a gate insulating film 18, and a base coat film 11. The slit 71 extends along the terminal section 4 between the display region 2 and the terminal section 4 in the frame region 3, and is formed to penetrate the interlayer insulating film 20, the gate insulating film 18, and the base coat film 11, and a surface of the resin substrate layer 7 is exposed.

The slit 71 is provided, and thus a wiring line lower layer portion 15A constituting a frame wiring line 15f is divided into a portion in the display region 2 side and a portion in the terminal section 4 side. In addition, a filling film 72 filling the inside of the slit 71 and covering an opening peripheral portion of the interlayer insulating film 20 is provided in the bendable portion 70. The filling film 72 is formed of the same material and in the same layer as a material and a layer of a flattening film 16. A height h1 of the filling film 72 on the interlayer insulating film 20 is smaller than a height h2 of the flattening film 16.

The frame region 3 is provided with a wiring line connecting layer 73 connecting the wiring line lower layer portion 15A in the display region 2 side via the slit 71 to the wiring line lower layer portion 15A in the terminal section 4 side. The wiring line connecting layer 73 is formed to extend on the filling film 72 from the display region 2 side to the terminal section 4 side and transverse the slit 71, and is exposed on the filling film 72 from the flattening film 16. The wiring line connecting layer 73 is connected via a contact hole 74 formed in the interlayer insulating film 20 to the wiring line lower layer portion 15A in the display region 2 side and to the wiring line lower layer portion 15A in the terminal section 4 side.

The wiring line connecting layer 73 is formed of the same material and in the same layer as a material and a layer of a first electrode 29. As with the wiring line upper layer portion 15B constituting the wiring line terminal 15t, the wiring line connecting layer 73 includes a layered structure in which a first conductive layer 75, a second conductive layer 76, and a third conductive layer 77 are sequentially layered as illustrated in FIG. 15. The second conductive layer 76 is formed with a width smaller than the width of each of the first conductive layer 75 and the third conductive layer 77, and thus a portion of a perimeter edge surface corresponding to the second conductive layer 76 include a recessed portion 78 recessed inward of the wiring line connecting layer 73.

Moreover, as with the wiring line upper layer portion 15B, a resin cover 79 covering a perimeter edge surface of a second conductive layer 48 is provided in the recessed portion 78 of the wiring line connecting layer 73. The resin cover 79 is formed of, for example, an organic resin material such as acrylate, polyurea, parylene, polyimide, and polyamide, and is provided only in the recessed portion 78 as with the resin cover 51 provided in the recessed portion 78 of the wiring line terminal 15t. A thickness t3 of the resin cover 79 is smaller than a thickness t4 of the wiring line connecting layer 73, and an outermost surface of the resin cover 79 is located at the lateral side of the wiring line connecting layer 73.

A method for manufacturing the organic EL display device 1 according to the fourth embodiment includes a slit forming step at the TFT layer forming step S01 described in the first embodiment. The slit forming step is performed, for example, between an interlayer insulating film forming step S15 and a source drain electrode forming step S16. At the slit forming step, a photolithography treatment is performed on the interlayer insulating film 20, the gate insulating film 18, and the base coat film 11, and the slit 71 is formed. Such formation of the slit 71 may be performed together with formation of the contact holes 25, 74 in the interlayer insulating film 20.

In addition, at a flattening film forming step S18, a photosensitive organic resin film is formed by a known coating method as described above. The organic resin film is patterned to form the flattening film 16, and the filling film 72 is formed to fill the slit 71. Subsequently, the filling film 72 is partially removed from the surface side by ashing, and a height h1 of the filling film 72 on the interlayer insulating film 20 is smaller than a height h2 of the flattening film 16.

In addition, at a first electrode forming step S21, a layered conductive film is formed by sequentially forming an ITO film, a silver alloy film, and an ITO film by a sputtering method as described above. The layered conductive film is patterned by a photolithography treatment, and thus a plurality of the first electrodes 29 are formed and a plurality of the wiring line connecting layers 73 are formed on the filling film 72 to transverse the slit 71. Due to etching in the photolithography treatment at this time, a side shift in which the second conductive layer 48 (AgMg layer) becomes thinner than a first conductive layer 47 and a third conductive layer 49 (both are ITO layers) occurs in each of the wiring line connecting layers 73, and the recessed portion 78 is formed.

Further, the method for manufacturing the organic EL display device 1 according to the fourth embodiment includes a resin cover forming step at the organic EL element forming step S02 described in the first embodiment. The resin cover forming step is performed between a first electrode forming step S21 and an edge cover forming step S22. At the resin cover forming step, the resin cover 79 is formed, by the same method as the resin cover forming step S17 at the TFT layer forming step S01 described in the first embodiment, in the recessed portion 78 of the wiring line connecting layer 73 exposed on the filling film 72 from the flattening film 16.

In the method for manufacturing the organic EL display device 1 according to the fourth embodiment, a resin cover 51 may also be formed in a recessed portion 50 of a wiring line upper layer portion 15B together with forming the resin cover 79 in the recessed portion 78 of the wiring line connecting layer 73. That is, in the method for manufacturing the organic EL display device 1 according to the fourth embodiment, it is unnecessary to perform the resin cover forming step S17 at the TFT layer forming step S01 described in the first embodiment.

As described above, the organic EL display device 1 including the bendable portion 70 can be manufactured.

According to the organic EL display device 1 according to the fourth embodiment, the frame region 3 can be bent in the bendable portion 70 maximally to an angle of approximately 180°. In addition, the resin cover 79 covering the perimeter edge surface of the second conductive layer 76 is provided in the recessed portion 78 formed in a perimeter edge surface of the wiring line connecting layer 73 exposed from the flattening film 16. Thus, the second conductive layer 76 of the wiring line connecting layer 73 can be protected by the resin cover 79. Regarding the rest, the same effects as those of the first embodiment can be obtained.

Fifth Embodiment

Figure 16:
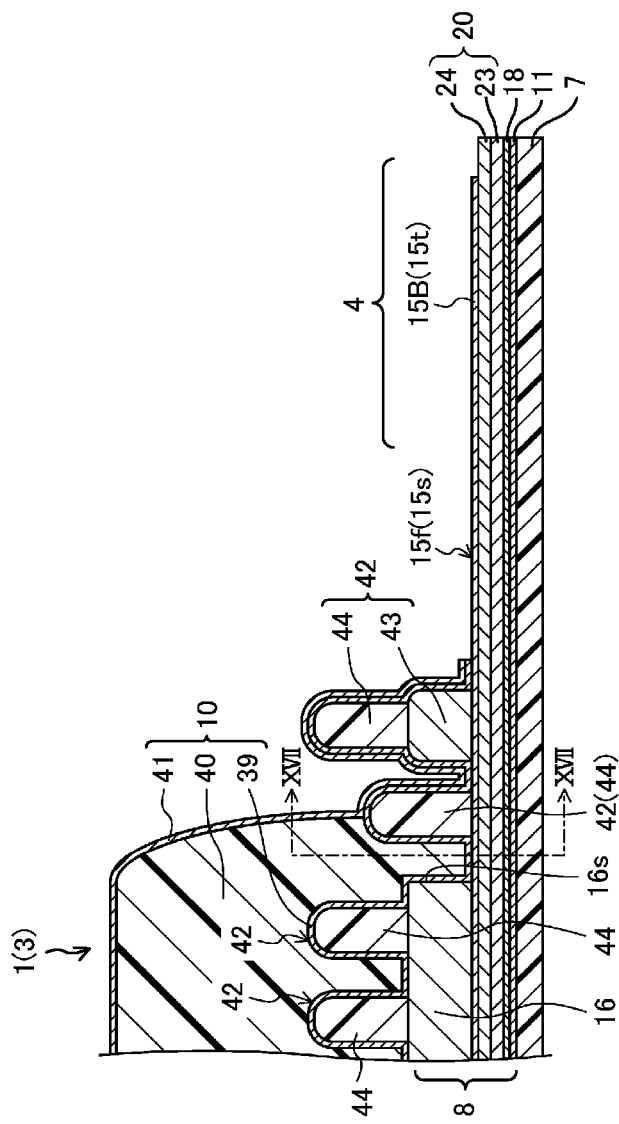
FIG. 16 is a view equivalent to FIG. 6 and illustrating an organic EL display device according to a fifth embodiment.
Figure 17:
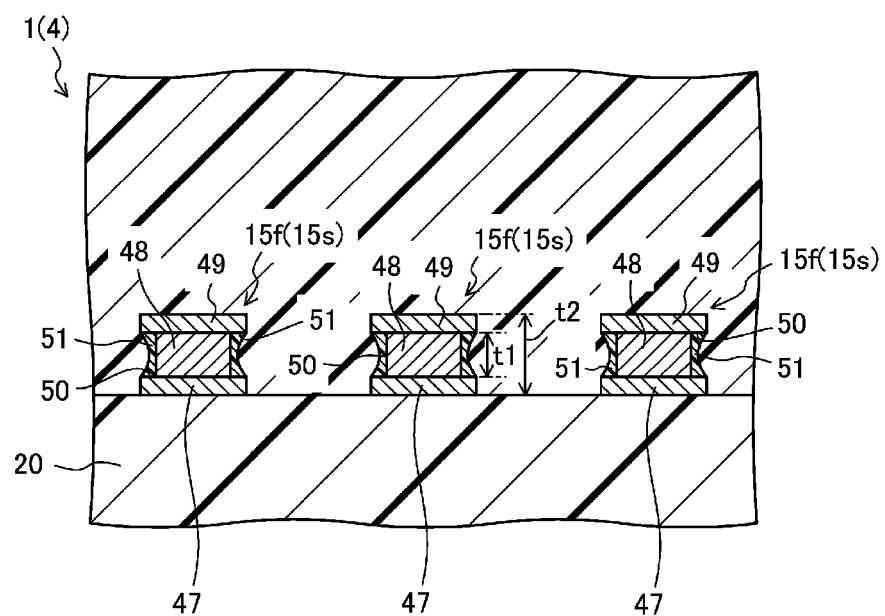
FIG. 17 is a cross-sectional view taken along line XVII-XVII and illustrating a main portion of the organic EL display device of FIG. 16.

FIG. 16 is a view equivalent to FIG. 6 of an organic EL display device 1 according to a fifth embodiment. FIG. 17 is a cross-sectional view taken along line XVII-XVII and illustrating a main portion of the organic EL display device 1 of FIG. 16. The organic EL display device 1 according to the fifth embodiment differs from the first embodiment in a configuration of a frame wiring line 15f constituting each of source wiring lines 15s. As illustrated in FIG. 16, in the organic EL display device 1, the frame wiring line 15f constituting each of the source wiring lines 15s is formed of the same material and in the same layer as a material and a layer of a source electrode 21 and a drain electrode 22, and the source wiring line 15s of a display region 2 is led out directly on an interlayer insulating film 20 to a terminal section 4.

The frame wiring line 15f constituting each of the source wiring lines 15s is exposed from a flattening film 16 inside of a slit 16s between the flattening film 16 and a dam wall 42 and is exposed in an outer side of the dam wall 42. As illustrated in FIG. 17, in each of the source wiring lines 15s, a portion of a perimeter edge surface corresponding to a second conductive layer 48 entirely includes a recessed portion 50 recessed inward of the wiring line terminal 15t. Moreover, a resin cover 51 covering a perimeter edge surface of the second conductive layer 48 is provided in the recessed portion 50 of each of the source wiring lines 15s.

As described above, in a case where the source wiring line 15s of the display region 2 is led out directly on the interlayer insulating film 20 to the terminal section 4, in a manufacturing process of the organic EL display device 1, moisture may enter along the source wiring line 15s into the device 1 through the recessed portion 50 formed in a perimeter edge surface of the frame wiring line 15f. Additionally, the number of the frame wiring lines 15f constituting the source wiring lines 15s is significantly greater than the other display wiring lines 15 to provide a high-definition display screen. Thus, moisture easily enters along a large number of source wiring lines 15s into the device 1, and causes a significant adverse effect on reliability of the organic EL display device 1.

Thus, the organic EL display device 1 of the first embodiment employs the configuration in which the frame wiring line 15f constituting each of the source wiring lines 15s is formed of the same material and in the same layer as a material and a layer of the gate wiring line 15g and the gate electrode 19, and is led out from the display region 2 through the lower layer of the interlayer insulating film 20 to the terminal section 4. According to such a configuration of the frame wiring line 15f, reliability of the organic EL display device 1 improves, but since resistance of the source wiring line 15s increases, delay or dullness of a data signal transmitted by the source wiring line 15s occurs.

In contrast, according to the organic EL display device 1 according to the fifth embodiment, the frame wiring line 15f constituting each of the source wiring lines 15s is led directly on the interlayer insulating film 20 to the terminal section 4. Thus, delay or dullness of a source signal transmitted by the source wiring line 15s can be reduced. Moreover, since the resin cover 51 is provided in the recessed portion 50 formed in a perimeter edge surface of each of the source wiring lines 15s including the frame wiring line 15f, moisture can be prevented from entering the display region 2 through the recessed portion 50 along the source wiring line 15s. Accordingly, deterioration of an organic EL element 9 can be suppressed, and reliability of the organic EL display device 1 can be improved.

As described above, the preferred embodiments are described as examples of the techniques of the present disclosure. However, the techniques of the present disclosure are not limited to these embodiments, and can be applied to an embodiment in which change, replacement, addition, omission, and the like are made as appropriate. In addition, the components described in the above-described embodiments can be combined to provide a new embodiment. In addition, the components described in the accompanying drawings and the detailed description may also include components that are unessential to solve the problems. Thus, the unessential components are not to be immediately determined to be essential as the unessential components are described in the accompanying drawings and the detailed description.

For example, the first to fifth embodiments may include the following configurations.

In the first to fifth embodiments, as for the wiring line upper layer portion 15B constituting the wiring line terminal 15t of the display wiring line 15, the first conductive layer 47 and the third conductive layer 49 are formed of titanium (Ti); however, the application scope of the techniques of the present disclosure is not limited to this. The first conductive layer 47 and the third conductive layer 49 may be formed of, for example, an alloy including titanium nitride (TiN), titanium oxide (TiO), or other type of titanium (Ti) as main components instead of titanium (Ti), and may be formed of, in addition to titanium (Ti), molybdenum (Mo), chromium (Cr), niobium (Nb), tantalum (Ta), or tungsten (W), or an alloy thereof. The first conductive layer 47 and the third conductive layer 49 may be formed including at least one element selected from these metallic elements.

In addition, in the first to fifth embodiments, as for the wiring line upper layer portion 15B constituting the wiring line terminal 15t of the display wiring line 15, the second conductive layer 48 is formed of aluminum (Al); however, the application scope of the techniques of the present disclosure is not limited to this. Instead of aluminum (Al), the second conductive layer 48 may be formed of, for example, copper (Cu) or silver (Ag) or an alloy including copper (Cu) and silver (Ag) as main components, or may be formed including at least one element selected from aluminum (Al), copper (Cu), and silver (Ag).

In addition, in the first to fifth embodiments, as for the wiring line upper layer portion 15B constituting the wiring line terminal 15t of the display wiring line 15, a three-layer structure of the first conductive layer 47, the second conductive layer 48, and the third conductive layer 49 is exemplified, but the application scope of the techniques of the present disclosure is not limited to this. The wiring line upper layer portion 15B may include a layered structure of four or more layers, including the first conductive layer 47, the second conductive layer 48, and the third conductive layer 49.

In addition, in the first to fifth embodiments, the organic EL layer 30 is formed individually in each of the subpixels 6; however, the application scope of the techniques of the present disclosure is not limited to this. The organic EL layer 30 may be provided in common among the plurality of subpixels 6. In this case, the organic EL display device 1 may express a color tone of each of the subpixels 6, for example by providing a color filter.

In addition, in the first to fifth embodiments, the organic EL display device 1 using the resin substrate layer 7 as the base substrate is exemplified; however, the application scope of the techniques of the present disclosure is not limited to this. An inorganic material such as glass and quartz, a plastic material such as polyethylene terephthalate, or a ceramic such as alumina may be used as the base substrate. In addition, the base substrate may be a substrate obtained by coating one surface of a metallic substrate of aluminum, iron, or the like with silica gel, an organic insulating material, or the like, or a substrate obtained by subjecting a surface of a metallic substrate to an insulating treatment by a method such as anode oxidation.

In addition, in the first to fifth embodiments, the top gate type structure is employed for the first TFT 12 and the second TFT 13; however, the application scope of the techniques of the present disclosure is not limited to this. The first TFT 12 and the second TFT 13 may employ a bottom gate type structure.

In addition, in the first to fifth embodiments, the organic EL layer 30 including a five-layer structure of the hole injection layer 34, the hole transport layer 35, the light-emitting layer 36, the electron transport layer 37, and the electron injection layer 38 is exemplified; however, the application scope of the techniques of the present disclosure is not limited to this. The organic EL layer 30 may employ, for example, a three-layer structure of a hole injection-cum-transport layer, a light-emitting layer, and an electron transport-cum-injection layer.

In addition, in the first to fifth embodiments, the organic EL display device 1 including the first electrode 29 as an anode electrode and the second electrode 31 as a cathode electrode is exemplified; however, the application scope of the techniques of the present disclosure is not limited to this. The techniques of the present disclosure can be applied, for example, to an organic EL display device including the first electrode 29 as a cathode electrode and the second electrode 31 as an anode electrode by reversing the layered structure of the organic EL layer 30.

In addition, in the first to fifth embodiments, the organic EL display device 1 is exemplified as a display device, but the application scope of the techniques of the present disclosure is not limited to this. The techniques of the present disclosure can be applied to a display device including a plurality of light-emitting elements driven by current, for example, a display device including a quantum dot light-emitting diode (QLED) that is a light-emitting element using a quantum dot containing layer.

INDUSTRIAL APPLICABILITY

As described above, the techniques of the present disclosure are useful for a display device and a method for manufacturing the display device.

The invention claimed is:

1. A display device comprising:
a base substrate;
a wiring line provided on the base substrate;
a flattening film covering the wiring line; and
a light-emitting element provided on the flattening film,
wherein the wiring line includes a layered structure in which a first conductive layer, a second conductive layer, and a third conductive layer are layered sequentially from the base substrate side,
in the wiring line, the second conductive layer is formed with a width smaller than a width of each of the first conductive layer and the third conductive layer, and a portion of a perimeter edge surface corresponding to the second conductive layer includes a recessed portion recessed inward of the wiring line, and the wiring line is exposed, including the perimeter edge surface, from the flattening film,
a resin cover covering a perimeter edge surface of the second conductive layer is provided in the recessed portion in a portion of the wiring line exposed from the flattening film, and
the resin cover has a thickness smaller than a thickness of the wiring line.

2. The display device according to claim 1, comprising:
a display region in which an image is displayed by light emission of the light-emitting element; and
a frame region provided in a periphery of the display region,
wherein a terminal section is provided in the frame region,
the wiring line is led out from the display region to the terminal section of the frame region, and
at least a portion of the wiring line located in the terminal section is exposed from the flattening film and includes the resin cover in the recessed portion.

3. The display device according to claim 2,
wherein an interlayer insulating film is provided in a lower layer of the flattening film on the base substrate,
the wiring line includes a wiring line lower layer portion located in a lower layer of the interlayer insulating film, and a wiring line upper layer portion located in an upper layer of the interlayer insulating film,
the wiring line lower layer portion is provided between the display region and the terminal section in the frame region,
the wiring line upper layer portion is located in the terminal section and is connected to the wiring line lower layer portion via a contact hole formed in the interlayer insulating film, and
the wiring line upper layer portion includes the layered structure provided with the resin cover and is exposed from the flattening film.

4. The display device according to claim 3,
wherein a portion of the wiring line upper layer portion connected to the wiring line lower layer portion is covered by an insulating layer.

5. The display device according to claim 4,
wherein the insulating layer is formed of the same material and in the same layer as a material and a layer of the flattening film.

6. The display device according to claim 2,
wherein a slit in which a lower layer of the flattening film is exposed is formed in an outer periphery of the flattening film and surrounds the display region,
the wiring line is a source wiring line configured to transmit a source signal to the display region, and a plurality of the wiring lines are formed and transverse the slit, and
the resin cover is provided in the recessed portion in a portion of the wiring line located inside the slit.

7. The display device according to claim 2,
wherein the base substrate is a flexible resin substrate,
at least one inorganic film is provided in the frame region together with the wiring line on the base substrate,
a slit extending along the terminal section between the display region and the terminal section in the frame region is formed in the at least one inorganic film,
a portion of the frame region corresponding to the slit includes a filling film filling the slit, and constitutes a bendable portion more easily bendable than other portions, the wiring line is formed on the filling film and transverses the slit, and the resin cover is provided in the recessed portion at a portion of the wiring line exposed from the flattening film on the filling film.

8. The display device according to claim 1, wherein a plurality of the wiring lines are provided, and extend adjacent to each other, and the resin cover is separated for each of the plurality of wiring lines adjacent to each other.

9. The display device according to claim 1, wherein a plurality of the wiring lines are provided, and extend adjacent to each other, and the resin cover is provided in common between the plurality of wiring lines adjacent to each other.

10. The display device according to claim 1, wherein the first conductive layer and the third conductive layer include at least one element selected from titanium, molybdenum, chromium, niobium, tantalum, and tungsten, and the second conductive layer includes at least one element selected from aluminum, copper, and silver.

11. The display device according to claim 1, wherein the light-emitting element is an organic EL element.

12. A method for manufacturing a display device, the method comprising:

a wiring line forming step of forming a wiring line on a base substrate, the wiring line including a layered structure in which a first conductive layer, a second conductive layer, and a third conductive layer are sequentially layered, and the wiring line being provided with a recessed portion in a portion of a perimeter edge surface corresponding to the second conductive layer, the recessed portion being recessed inward of the wiring line; and a resin cover forming step of forming a resin cover covering a perimeter edge surface of the second conductive layer of the wiring line, wherein the resin cover forming step includes a film forming step of forming, by vapor deposition, a resin film covering the wiring line, and an ashing step of forming the resin cover by ashing a resin film formed at the film forming step, the resin cover having a thickness smaller than a thickness of the wiring line.

13. The method for manufacturing a display device according to claim 12, further comprising a flattening film forming step of, prior to the resin cover forming step, forming a flattening film covering the wiring line, wherein at the flattening film forming step, a portion of the wiring line is exposed, including a perimeter edge surface, from the flattening film, and at the resin cover forming step, the resin cover is formed in the recessed portion at a portion of the wiring line exposed from the flattening film.

14. The method for manufacturing a display device according to claim 12, wherein at the wiring line forming step, a plurality of the wiring lines are formed to extend adjacent to each other, and at the resin cover forming step, the resin film is partially removed by ashing and a forming surface of each of the plurality of wiring lines on the base substrate is exposed between the plurality of wiring lines adjacent to each other, and the resin cover is separated for each of the plurality of wiring lines adjacent to each other.

15. The method for manufacturing a display device according to claim 12, wherein at the wiring line forming step, a plurality of the wiring lines are formed to extend adjacent to each other, and at the resin cover forming step, the resin film is partially removed by ashing and a top surface of each of the plurality of wiring lines is exposed, and the resin cover is formed in common between the plurality of wiring lines adjacent to each other.

16. The method for manufacturing a display device according to claim 12, comprising:

an inorganic film forming step of forming at least one inorganic film together with the wiring line on the base substrate by using a flexible resin substrate as the base substrate;

a slit forming step of forming a slit in the at least one inorganic film;

a flattening film forming step of, prior to the resin cover forming step, forming a flattening film covering the wiring line; and an electrode forming step of forming an electrode on the flattening film, wherein at the flattening film forming step, after an organic film is formed by a coating method, the organic film is patterned and the flattening film is formed, and a filling film filling the slit is formed and the filling film is ashed, a height of the filling film being smaller than a height of the flattening film, at the electrode forming step, after a conductive film is formed, the conductive film is patterned and the electrode is formed, and a portion of the wiring line including the layered structure is formed on the filling film, and transverses the slit, and at the resin cover forming step, the resin cover is formed in the recessed portion in a portion of the wiring line exposed from the flattening film on the filling film.

* * * * *